United States Patent [19]
Safari et al.

[11] Patent Number: 6,004,500
[45] Date of Patent: Dec. 21, 1999

[54] METHODS FOR PRODUCING NOVEL CERAMIC COMPOSITES

[75] Inventors: Ahmad Safari, Princeton Junction; Victor F. Janas, Monroe Township; Amit Bandyopadhyay, Edison; Rajesh K. Panda, New Brunswick; Mukesh Agarwala, Highland Park; Stephen C. Danforth, Belle Mead, all of N.J.

[73] Assignee: Rutgers, The State University of New Jersey, New Brunswick, N.J.

[21] Appl. No.: 09/081,308

[22] Filed: May 19, 1998

Related U.S. Application Data

[62] Division of application No. 08/622,510, Mar. 25, 1996, Pat. No. 5,818,149.

[51] Int. Cl.$^6$ ................................................. C04B 33/32
[52] U.S. Cl. .......................... 264/610; 264/614; 264/621; 264/642; 264/125; 264/219
[58] Field of Search ................................. 264/610, 621, 264/642, 219, 250, 614, 125

[56] References Cited

U.S. PATENT DOCUMENTS

| | | | |
|---|---|---|---|
| 4,929,402 | 5/1990 | Hull | 264/22 |
| 5,121,329 | 6/1992 | Crump | 364/468 |
| 5,164,920 | 11/1992 | Bast et al. | 367/140 |
| 5,340,433 | 8/1994 | Crump | 156/578 |
| 5,660,877 | 8/1997 | Venkataramani et al. | 427/100 |

OTHER PUBLICATIONS

Harris L. Marcus et al., "Solid Freeform Fabrication Finds New Appliations", Advanced Materials and Processes, Sep. 1993, pp. 28–35.

Curtis Griffin et al., "Desktop Manufacturing: LOM vs. Pressing", American Ceramic Society Bulletin, vol. 73, No. 8, Aug. 1994, pp. 109–113.

M.K. Agarwala et al, "Structural Ceramics by Fused Deposition of Cermaics", Solid Freeform Fabrication Symposium, Aug. 1995.

K. Lubitz et al., "Microstructuring Technology", Proceedings 1993 IEEE Utrasonics Symposium Mar. 1993.

Lubitz et al, "New Piezoelectric Composites For Ultrosonic Transducers", Ferroelectrics, vol. 133, 1992, pp. 21–26.

Bast et al, "A New Technique For The Production of Piezoelectric Composites With 1–3 Connectivity", Ceramics Today—Tomorrow's Ceramics, 1991, pp. 2005–2015.

E.W. Becker et al., "Fabrication of Microstructures With High Aspect Ratios . . . ", Microelectronic Engineering, 1986, pp. 35–56.

W. Wersing, "Composite Piezoelectics for Utrasonic Transducers", IEEE Proceedings of International Symposium on the Applications of Ferroelectrics (ISAF), pp. 212–223 (1986).

R. Van Weeren et al., "Quality of Parts Processed by Fuse Deposition", Proceedings of Solid Free Form Fabrication Symposium, Aug. 1995.

CL Atwood et al., "Rapid Prototyping Applications for Manfacturing", SAMPE Journal, vol. 32, No. 1, Jan./Feb. 1996 pp. 55–60.

*Primary Examiner*—Christopher A. Fiorilla
*Attorney, Agent, or Firm*—John F. Ritter

[57] ABSTRACT

A process for making ceramic composites includes the steps of: a) forming a polymer composition into a three-dimensional mold; b) filling said three-dimensional mold with one or more ceramic containing compositions; c) heating said filled mold to dry and sinter the ceramic; d) removing at least a portion of said three-dimensional mold thereby forming voids; and e) filling the voids with a second composition which has a piezoelectric coefficient which is substantially different from the piezoelectric coefficient of said ceramic structure. Steps a through e yield a controlled, non-random piezoelectric ceramic composite having 2-3, 3-2 or 3—3 connectivity with respect to the sintered ceramic and the second composition throughout the composite.

14 Claims, 5 Drawing Sheets

METHODS FOR PRODUCING NOVEL CERAMIC COMPOSITES

CROSS REFERENCE TO RELATED APPLICATIONS

This is a Divisional of U.S. Ser. No. 08/622,510 filed on Mar. 25, 1996 U.S. Pat. No. 5,818,149.

TECHNICAL FIELD

This invention relates to a method for fabricating ceramic composites and unique composites so fabricated. More particularly, it provides an improved and more efficient method, using solid freeform fabrication techniques, for fabricating ceramic composites having one or more combinations of ceramics, metals, glasses, or polymers.

BACKGROUND OF THE INVENTION

Composites are often made to create a beneficial mix of the properties of dissimilar materials that are unobtainable in a single homogenous material. In the field of transducers for example, it can be advantageous to use a piezoelectric ceramic-polymer composite, rather than a monolithic block of of piezoelectric material such as lead zirconate titanate (PZT). Piezoelectric composites consist predominantly of a polarizable phase embedded in a non-polarizable material.

These composites have many advantages over traditional monolithic piezoelectric ceramics including: (i) lower densities resulting in acoustic impedance closer to those of the human body, water, etc., thereby eliminating the need for an acoustic matching layer; (ii) low dielectric constants resulting in a high piezoelectric voltage constant g; and (iii) ease of conformability to the shape of the backing material of the composite. Such composite piezoelectric transducers and methods for their production, are described, for example, in Composite Piezoelectric Transducer; R. E. Newnham et al.; *Materials in Engineering*, Vol. 2, December 1980, Pages 93–106, which is incorporated herein by reference.

Three composite designs that have been particularly successful are composites with 2-2, 3-3 and 1-3 connectivity, in which piezoelectric ceramic sheets or network or rods are aligned in the poling direction of the composite and embedded in a matrix of a suitable polymer. In the case of the 2-2 composite, both the ceramic and polymer phases are two-dimensionally self-connected throughout the composite. The stiff ceramic phase supports most of the stress applied in the direction of its alignment, yielding a high piezoelectric charge coefficient d, while the composite has a low density and dielectric constant.

In the 3-3 composite, both the ceramic and the polymer phases are continuously self-connected in all three dimensions. The geometry and structure yields a high piezoelectric charge coefficient d and exhibits superior properties over single phase piezoelectrics.

In the 1-3 composite, the ceramic phase is one-dimensionally self-connected through the composite, while the polymer phase is three-dimensionally self-connected. For some applications, the 1-3 composite yields superior properties to those described above for the 2-2 composite due to the lower density and dielectric constant.

A common and convenient method for making 2-2 and 1-3 composites is to start by cutting parallel slots into a monolithic piezoelectric ceramic block. The slots are then filled with a polymer. The aforementioned method is known as the "dice and fill" method and is described in PZT-Epoxy Piezoelectric Transducers: A Simplified Fabrication Procedures, H. P. Savakus et al.; *Materials Research Bulletin*, Vol. 16, 1981, pages 677–680, which is incorporated herein by reference.

Two common methods for making piezoelectric composites with 3-3 connectivities are the replamine and burned-out plastic spheres, or BURPS, processes. The replamine process is a lost wax method with coral as a starting material. The coral is machined to the desired geometry and then back-filled with wax. After the wax is hardened, the coral skeleton is leached away using hydrochloric acid leaving a wax negative of the original coral template.

The wax negative is back-filled with PZT slurry and dried. The wax is subsequently burned off at a moderate temperature, leaving a coral-type structure of PZT. The structure is then sintered and back-filled with a desired polymer, usually a non-polarizable one, to make the final structure. The structure is then poled using conventional poling or corona discharge technique. The replamine process is described in Flexible Composite Transducers, D. P. Skinner et al.; *Materials Research Bulletin*, Vol. 13, 1978, pages 599–607 and is herein incorporated by reference.

In the case of the BURPS process, plastic spheres and PZT powders are mixed in an organic binder. After binder burn-out and sintering, a porous PZT skeleton is formed and later back-filled with polymer to form a 3-3 composite. The BURPS process is described in Simplified Fabrication of PZT/Polymer Composites, T. R. Shrout et al.; *Materials Research Bulletin*, Vol. 14, 1979, pages 1553–1559 which is also incorporated herein by reference.

Although, as mentioned above, piezoelectric composites typically consist of a polarizable phase embedded in a non-polarizable phase, there is a need to develop efficient methods for the manufacture of composites having multiple polarizable and/or non-polarizable phases. Also, there is a need to develop more efficient methods for the manufacture of piezoelectric composites having decreased size and periodicity of the polarizable phase or phases. Composites having these properties have been identified as a key area of transducer development.

Moreover, there has been a drive to create so-called "smart" materials. Smart materials are described in Smart Ceramics; Newnham et al., *Ferroelectrics*, Vol. 102, pp. 259–266 which is incorporated herein by reference. A smart material senses a change in the environment, and, using a feedback system, makes a useful response. It includes both a sensor phase and an actuator phase. A very smart material can tune its sensor and actuator functions in time and space to optimize its behavior. Tuning of a very smart material can be accomplished by using a multitude of polarizable phases.

It is well recognized in the art that the dice and fill, replamine and BURPS methods of forming composites have several limitations in meeting the above stated needs. For example, in the case of replamine process, the design, volume fraction and the scale of the structure depends on the starting coral template and can not be altered. The BURPS process too, lacks the flexibility of the design and fabrication of a fine scale 3-3 PZT composite structure with a controlled volume fraction.

In all of these processes, varying the ceramic volume content across the composite is not practical. Additionally, these techniques are designed for monolithic ceramics, ruling out the possibility of efficient and effective manufacture of multiphase ceramic composites.

Recently, solid freeform fabrication techniques have been developed for producing three-dimensional articles without the need for molds, dies, or other tooling. One such technique, commercialized by Stratysys™, Inc. of Eden Prarie, Minn., builds solid objects layer by layer from polymer/wax compositions by using computer-aided design (CAD) software programs. According to the technique, which is described in U.S. Pat. No. 5,121,329 and is incorporated herein by reference, a flexible filament of the polymer/wax composition is fed by a pair or counter rotating rollers into a dispensing head which includes a liquifier and nozzle outlet. Inside the liquifier, the filament softens and melts at a temperature just above its melting point.

As the counter-rotating rollers continue to advance the solid filament into the liquifier, the force of the incoming solid filament extrudes the molten material out from the nozzle where it is deposited on a build platform positioned in close proximity to the dispensing head. The CAD software controls the movement of the dispensing head in the horizontal X-Y plane and controls the movement of the build platform in the Z direction. By controlling the processing variables, the extruded bead, called a "road", can be deposited layer by layer in areas defined from the CAD model, leading to the creation of an object that is a three-dimensional depiction of the CAD model.

Although the fused deposition technique is explained in detail above, other techniques, including, but not limited to, stereolithography, selective laser sintering, sanders prototype, and laminated object manufacturing can be used in this invention. In stereolithography, for example, as described in U.S. Pat. No. 4,929,402, which is herein incorporated by reference, an ultraviolet ray curable polymer is used as a feed material and a computer controlled and focused beam of ultra violet rays is used to fabricate three dimensional objects.

In selective laser sintering, which is described in U.S. Pat. No. 4,938,816 and which is hereby incorporated by reference, a laser curable polymer is used as a feed material and a computer controlled and focused laser beam is used to fabricate three dimensional objects. In Sanders™ Prototype technology, an ink jet printing process is used where a thermoplastic polymer is used instead of an ink. Three-dimensional objects are built by depositing layer upon layer of thermoplastic polymer on a computer controlled fixture-less platform.

In Laminated Object Manufacturing (LOM), sheets of paper, polymer, or ceramic materials are deposited on top of each previous layer and a computer controlled laser beam is used to cut the sheet of material to make the three dimensional object.

This invention takes advantage of the aforementioned solid freeform fabrication technology to overcome many of the limitations of electronic ceramic composite manufacturing technology. Moreover, the disclosed invention makes possible the efficient manufacture of such composites with phase geometries that have previously been impossible and/or impractical.

SUMMARY OF THE INVENTION

The object of this invention is to provide a more efficient and effective method for fabricating ceramic, metal, and polymer composites for a wide range of electronic ceramic applications.

Yet another object of this invention is to provide for efficiently manufactured electronic ceramic composites with geometries that have not previously been available.

A novel feature of this invention is either the negative or the positive of the structure can be made by using solid freeform fabrication (SFF) or layered manufacturing techniques. Although Fused Deposition Modeling (FDM™) is one of the SFF techniques which is discussed here in detail, the same concept/steps can be used to manufacture composites using other SFF techniques including, but not limited to, those briefly described above.

Some composite designs with certain phase geometries manufactured according to this process, particularly some 3-3 composite geometries, are not possible to manufacture using any conventional manufacturing technique. Moreover, the disclosed methodology is efficient, effective, flexible, and is suitable for modifying and optimizing different design geometries within a very short period of time.

A desired way to manufacture a composite according to this invention begins with the design of molds with different connectivities, fine structures (ceramic phase less than about 100 microns), and controlled volume fractions using computer aided design (CAD) program. Based on the design, the composite can be manufactured in two different ways:

i) in the first method, a polymer mold, the negative of the structure, is designed and fabricated using a SFF technique. The mold is infiltrated with a ceramic or other suitable slurry or suspension, dried or gelled, and cured. The assembly is either placed in a furnace or a solvent is used to remove the mold polymer and the binder and then sinter the structure.

ii) in the second method, the preform can be directly fabricated using a ceramic loaded polymer. The assembly is placed in a furnace to burn out the binder and then sinter the structure.

More specifically the process of this invention comprises the following steps:

A Process for Making a Composite Comprising the Steps of a) forming a polymer composition into a three-dimensional mold;

b) filling said three-dimensional mold with one or more ceramic compositions, said ceramic composition or compositions having a higher melting point than said polymer composition;

c) hardening said ceramic composition or compositions;

d) removing at least a portion of said three-dimensional mold; and e) filling the voids caused by the removal of said three-dimensional mold with a composition which has a piezoelectric coefficent which is substantially different from the piezoelectric coefficient of said ceramic composition or compositions.

One novel composite that can be manufactured using the process described above comprises at least one piezoelectric phase and at least one non-piezoelectric phase wherein the geometry and structure of said piezoelectric phase and said non-piezoelectric phase is controlled and wherein at least one said piezoelectric phase and one said non-piezoelectric phase are continuously self-connected in the x, y, and z directions.

BRIEF DESCRIPTION OF THE DRAWINGS

Comprehension of the invention is facilitated by reading the following detailed description in conjunction with the annexed drawings, in which:

FIG. 1 is a perspective drawing of layered manufacturing of a polymer mold of a 1-3 rod structure, where each layer is build on top of the previous one.

FIG. 2 is a perspective drawing of the mold after it has been filled with a ceramic slurry/gel and a base has been created.

FIG. 3 is a perspective drawing of the ceramic structure after the mold polymer is removed and the structure is sintered.

FIG. 4 is a perspective drawing of the ceramic structure after a desirable material has been embedded and the base removed.

FIG. 5 is a perspective drawing of the direct layer manufacturing of green ceramic structure, where ceramic powders are bonded together by a low melting binder.

FIG. 6 is a perspective drawing of the ceramic structure after it has been sintered.

FIG. 7 is a perspective drawing of the ceramic structure after a desirable material has been embedded and the base removed.

DETAILED DESCRIPTION OF THE INVENTION

FIGS. 1 through 4 show the steps for the indirect method of manufacturing a composite constructed in accordance with the principles of the present invention.

Figure 1:
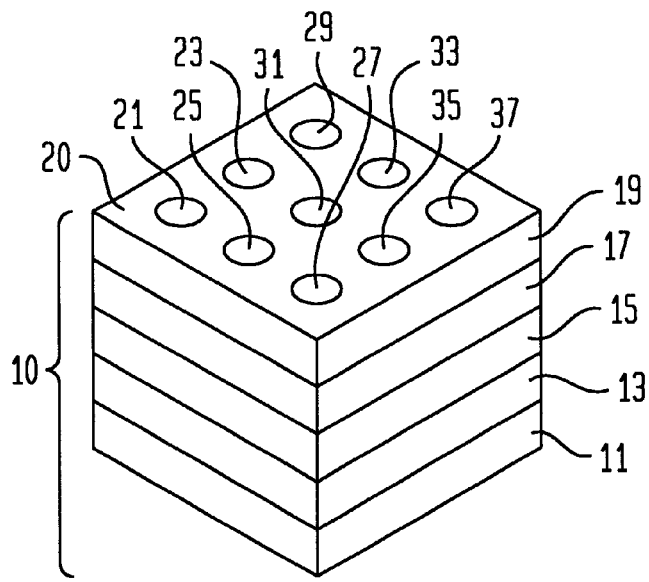
FIGS. 1 to 4 illustrate the sequence of steps which are used in manufacturing a composite via the indirect method, where the final composite is fabricated starting from a polymer mold or a negative of the structure.

FIG. 1 is a mold 10 which is formed by building individual layers 11, 13, 15, 17, and 19 on top of each other. The layers of material usually consist, for instance, of a multi-component waxed based thermoplastic polymer, such as investment casting wax containing polymer, elastomer, wax and a tackifier. Also, it could be a combination of other thermoplastic polymers, or ultra violet ray or laser curable polymers. Each layer 11, 13, 15, 17, and 19 is formed by using a solid freeform fabrication (SFF) or layered manufacturing techniques, such as Fused Deposition Modeling (FDM™), though the same concept/steps can be followed using other SFF techniques. Though hidden by the schematic of FIG. 1, each layer has the same pattern of that shown for layer 19, consisting of polymer 20, containing circular holes 21, 23, 25, 27, 29, 31, 33, 35, and 37. In the case of using the FDM™ technique to form the mold 10 of FIG. 1, liquid polymer beads are deposited and solidified continuously, creating a polymer road. When several roads are build next to each other, a layer with its own pattern, based on the mold design, is created. The solid areas of layer 19 of mold 10, are created by depositing and curing or solidifying the liquid polymers. The holes are created by not depositing or solidifying the polymer in that area of layer 19. In this case, the number of layers, of which only five are shown for simplification, and the pattern of each layer, of which the negative of a 1-3 rod structure is shown for simplification, are chosen to be equal to the desired thickness and architecture of the final transducer.

The holes in mold 10 are filled with a slurry or gelling solution by pouring, injection, or immersion of the structure. The slurry or gelling solution could be varied based on the requirements of the final composite and/or manufacturing considerations and may consist of, for instance, lead zirconate titanate [Pb(ZrTi)O$_3$], lead metaniobate [Pb(Nb$_2$O$_6$)], modified PbTiO$_3$ including [(Pb,Ca)TiO$_3$] and [(Pb,Sm)TiO$_3$], barium titanate [BaTiO$_3$], PMN—PT [(1−x)Pb(Mg$_{1/3}$Nb$_{2/3}$)O$_3$-xPbTiO$_3$], PZN—PT/BT [Pb(Zn$_{1/3}$Nb$_{2/3}$)O$_3$ BaTiO$_3$—PbTiO$_3$] or another suitable electronic ceramic material. The slurry would contain, in addition to the above mentioned ceraimics in particulate form, appropriate binders, dispersants, etc. to minimize the formation of agglomerates and to minimize the slurry viscosity to allow water infiltration into the mold. Such binders and dispersants may contain for example, low molecular weight organic alchohols for anti-foaming agents, acrylic binders, polymeric binders, and the like.

During slurry or gelling solution infiltration, a base 60 is sometimes created using the same material. The base 60 is created by overfilling the mold 10 with the slurry or gelling solution, allowing the excess to collect on the top of the mold 10. The base 60 will usually not be part of the final composite structure but is formed primarily for stability and/or handleability purposes during the manufacturing process and for certain composite designs.

Although not illustrated, a base could be formed by filling a container which becomes the form of the base with the slurry or gelling solution and subsequently placing the filled mold 10 on top of said container, which can be of any size and shape desired. This allows the slurry or gelling solution in the filled mold 10 to join with the slurry or gelling solution in the container, forming a base upon hardening. It should be noted that for certain composite designs and/or compositions a base may not need to be formed at all.

Figure 2:
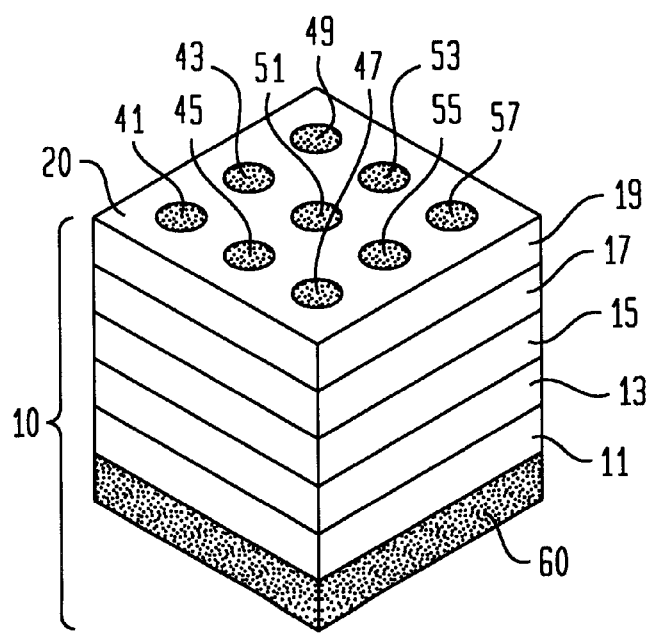

The structure is then dried, gelled, or cured in air or in some other environment. FIG. 2 shows mold 10 consisting of layers 11, 13, 15, 17, and 19, with slurry or gelling solution 41, 43, 45, 47, 49, 51, 53, 55, and 57 occupying the holes. Base 60, consisting of the same slurry of gelling solution, is also shown.

Figure 3:
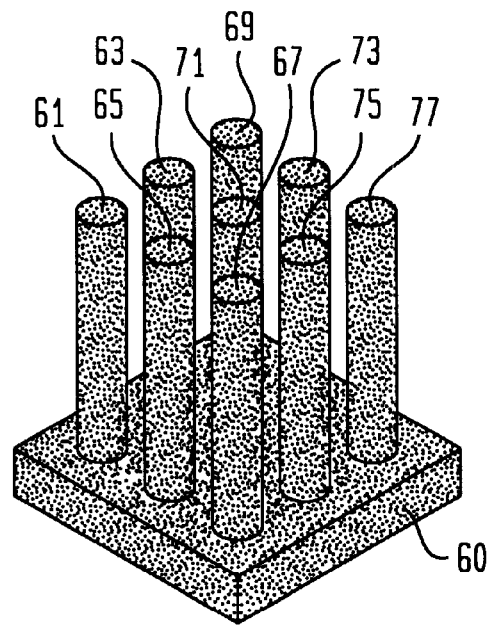

Either a solvent or a thermal cycle is used to remove the mold 10 and any organic components in the slurry or gelling solution prior to sintering. The thermal cycle is performed in a furnace in air, or in an inert gas environment such as nitrogen or argon, or in vacuum. FIG. 3 illustrates the results of the thermal cycle. Rods 61, 63, 65, 67, 69, 71, 73, 75, and 77 are intergrally attached to base 60.

The structure may then be sintered in a furnace using a conventional sintering cycle which is based, in part, on the piezoelectric material. After sintering, the gaps between all the rods are filled with a polarizable or non-polarizable filler material by pouring, injection or by immersion of the structure. The filler may consist either of a non-polarizable material such as self-hardening plastic, for example epoxy or silicone rubber or a polarizable material such as Poly (vinylidene flouride) and copolymers thereof, polyvinylchloride, polyvinylflouride, or other polymer having suitable piezoelectric properties. Moreover, the filler may also be paper, glass or ceramic.

At this point, the formation of 1-3 connectivity design is completed. That is, the rods 61, 63, 65, 67, 69, 71, 73, 75, and 77 are continuosly self-connected in one-dimension and the filler is continuously self-connected in three-dimensions.

Figure 4:
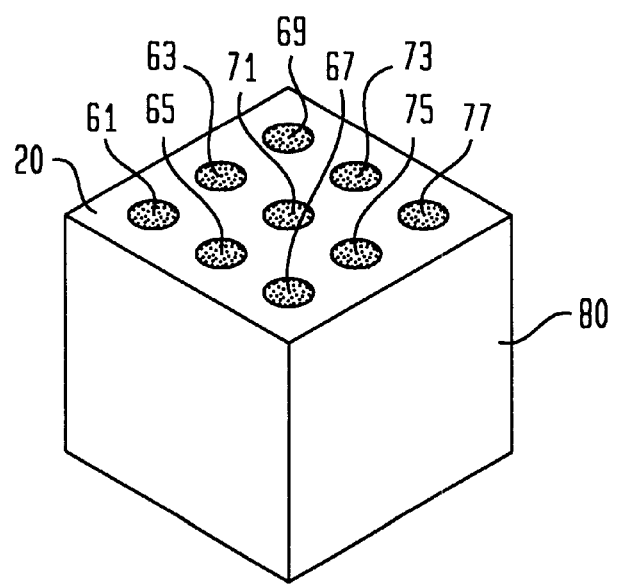

After the filler has filled in the gaps between the rods, base 60 is trimmed or lapped away. FIG. 4 shows a structure consisting of rods 61, 63, 65, 67, 69, 71, 73, 75, and 77 embedded in filler material 80. The composite is then electroded with silver paint, and poled under an electric field. At this point, the formation of composite with 1-3 connectivity from a polymeric mold manufactured via solid freeform fabrication is complete.

Figure 5:
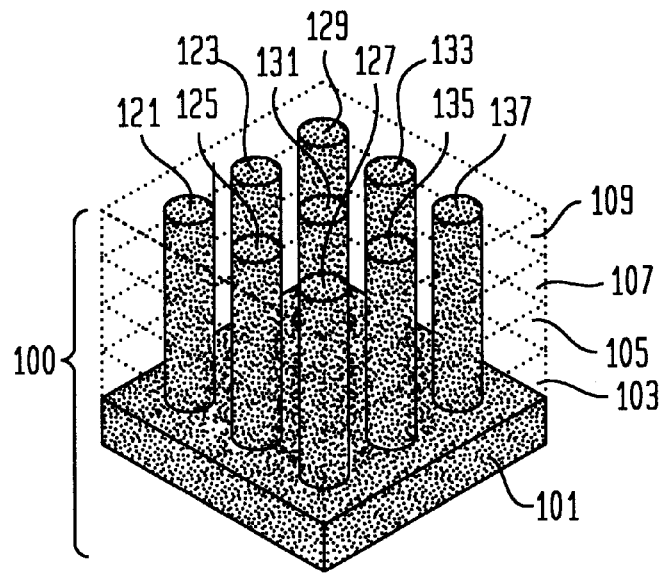
FIGS. 5 to 7 illustrate the sequence of steps which are used in manufacturing a composite via the direct method, where the final composite is fabricated starting from a green ceramic structure.

For manufacturing a piezoelectric composite using a direct manufacturing technique, ceramic powders mixed with different polymeric binders are used as a raw material. This mixture is then used to manufacture different individual layers to fabricate the composite structure directly. FIG. 5 is a green ceramic structure 100 which is formed by building individual layers 101, 103, 105, 107, and 109 on top of each other. The layers of material consist of a ceramic powder blended in a binder polymer.

The ceramic powder may consist of, for instance, lead zirconate titanate [$Pb(Zr,Ti)O_3$], lead metaniobate [$Pb(Nb_2O_6)$], modified $PbTiO_3$ including [$(Pb,Ca)TiO_3$] and [$(Pb,Sm)TiO_3$], barium titanate [$BaTiO_3$], PMN—PT [$(1-x)Pb(Mg_{1/3}Nb_{2/3})O_3-xPbTiO_3$], PZN—PT/BT [$Pb(Zn_{1/3}Nb_{2/3})O_3$ $BaTiO_3$—PbTiO], $(1-x-y)Pb(Zn_{1/3}Nb_{2/3})O_3-xPbTiO_3-yBaTiO_3$, and $(1-x-y)Pb(Zn_{1/3}Nb_{2/3})O_{3,3}-xBaTiO_3-yPbTiO_{3,xPZN}-(1-x)$PMN, xPMN-(1-x)PZT, XPZN-(1-x)PZT, or another suitable transmitting, receiving or sensing material. The polymeric binder may consist of, for instance, multi-component thermoplastic polymers, polymeric waxes, or ultraviolet ray or laser curable polymers.

Each layer 101, 103, 105, 107 and 109 is formed by using a solid freeform fabrication (SFF) or layered manufacturing techniques, such as a fused deposition process as described in M. K. Agarwala et al., *Proceedings of Solid Freeform Fabrication Symposium*, Austin, Tex., 1995, pp 1–8, which is hereby incorporated by reference. However, the same concept/steps can be followed using other SFF techniques. Though hidden by the schematic of FIG. 5, layer 101, which acts as a base, is a uniform sheet of ceramic/polymer blend. Layers 103, 105, and 107 have the same pattern of that shown for layer 109, consisting of, for example, circular spots 121, 123, 125, 127, 129, 131, 133, 135, and 137. In the case of using the FDC technique to form the structure 100 of FIG. 5, fluid ceramic/polymer blend beads are deposited and cured continuously, creating a layer with its own pattern, based on the ceramic design.

The solid areas of layer 109 of the structure 100, are created by depositing and solidifying particle-filled liquid or molten polymers. Voids are created by not depositing or curing the polymer in that area of layer 109. In this case, the number of layers, of which only five are shown for simplification, and the pattern of each layer, of which a 1-3 rod structure sitting on a base is shown for simplification, are chosen to be equal to the desired thickness and architecture of the final transducer. After building all the layers, the structure consists of green ceramic rods consisting of piezoelectric ceramic powders bonded together by polymeric binders.

Figure 6:
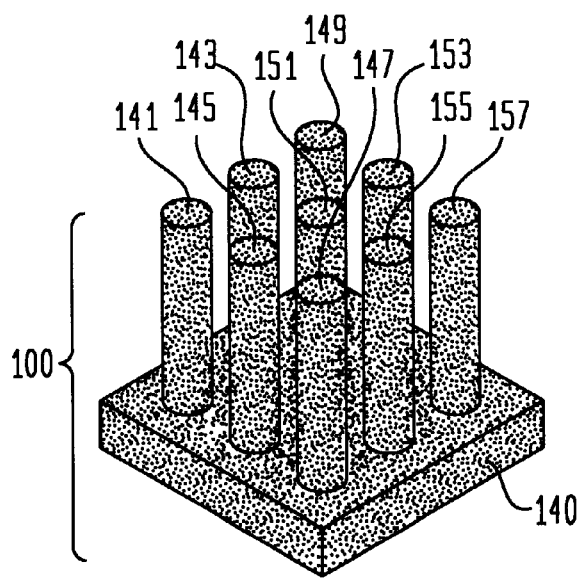

The polymeric binders may need to be removed from the structure 100 before sintering. A high temperature binder burnout cycle may be used to remove the binders from the structure before sintering or the structure may be sintered directly and during the course of sintering binder may be burned out from the structure. Binder also may be chemically dissolved from the structure before sintering. After binder burnout, the structure needs to be sintered. A sintering cycle may be used with a binder burn out cycle or after the binder burn out operation. Different piezoelectric materials need to be sintered using different sintering cycles and the cycle will depend on the composition. For instance, for lead zirconate titanate $Pb(Zr,Ti)O_3$, samples will be sealed in a crucible containing a lead source and will be heated at 3.5° C./minute to 1285° C. and held there for an hour. FIG. 6 illustrates the results of the thermal cycle. Rods 141, 143, 145, 147, 149, 151, 153, 155 and 157 are intergrally attached to base 140. Now the gaps between all the rods may be filled with a polarizable or non-polarizable filler material by pouring, injection or by immersion of the structure. The filler may consist either of a non-polarizable material such as self-hardening plastic, for example epoxy or silicone rubber or a polarizable material such as Poly(vinylidene flouride) and copolymers thereof, polyvinylchloride, polyvinylflouride, or other polymers having suitable piezoelectric properties. Moreover, the filler may also be paper, glass or ceramic. After the filler has filled in the gaps between the rods, the base is trimmed or lapped away. At this point, direct formation of a composite with 1-3 connectivity is completed by solid freeform fabrication.

Figure 7:
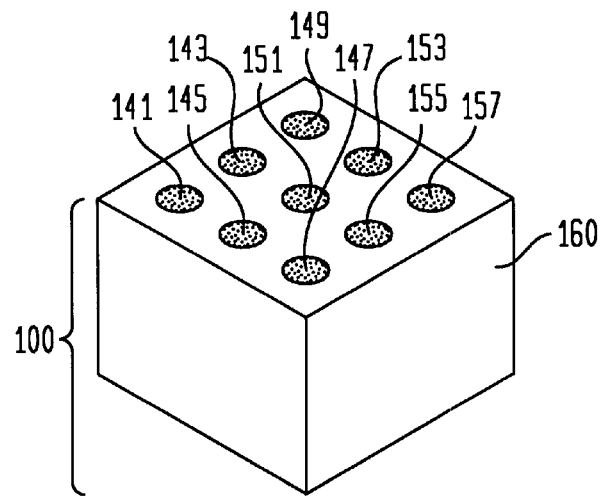

After the filler has filled in the gaps between the rods, base 140 is trimmed or lapped away. FIG. 7 shows a structure consisting of rods 141, 143, 145, 147, 149, 151, 153, 155, and 157 embedded in filler material 160. At this point, the formation of composite with 1-3 connectivity from a polymeric mold manufactured via solid freeform fabrication is complete.

Figure 8:
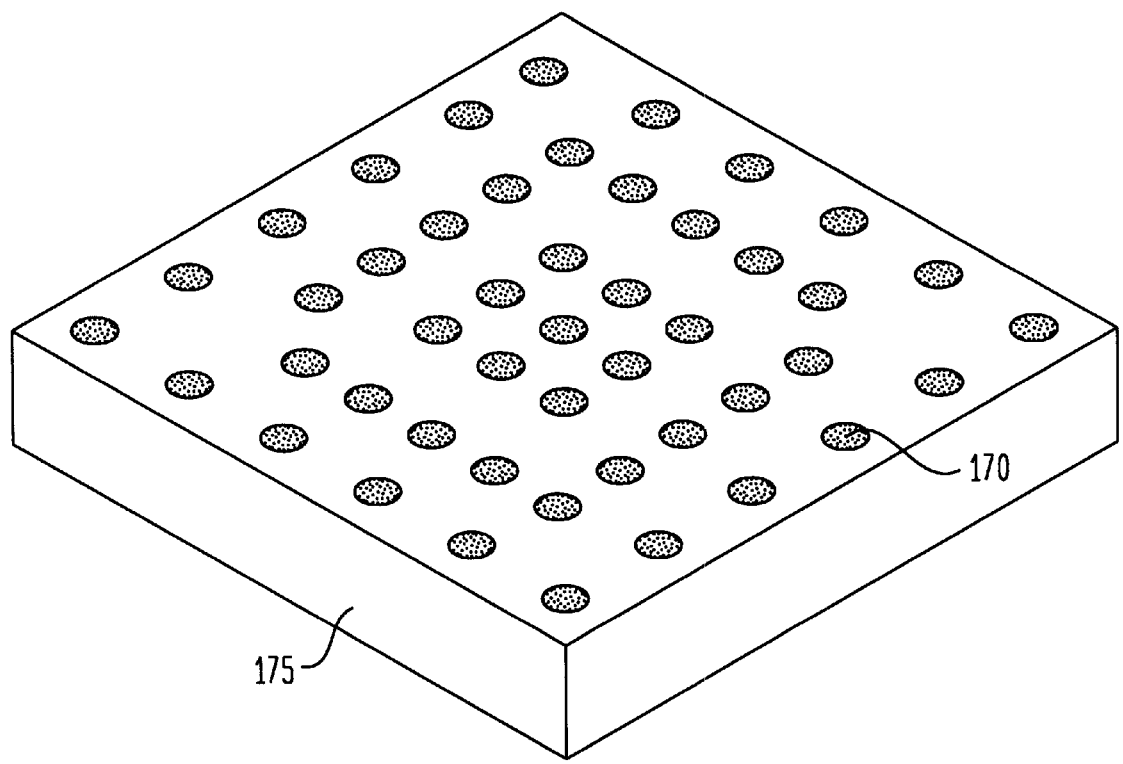
FIG. 8 is a perspective drawing showing a further embodiment according to the present invention in which the phase volume content across the device of one of the composite components is varied by varying the size and location of that phase.

As a further embodiment of the present invention, a composite material may be formed using either the indirect or direct method in which the polarizable phase volume content across the device is varied. FIG. 8 is a prospective drawing showing such an embodiment. The figure shows polarizable phase 170 embedded in a non polarizable filler material 175. The variation in polarizable phase volume content across the device is introduced into the composite during the manufacturing steps illustrated in FIG. 1 through FIG. 4, where different holes for 1-3 rods in FIG. 1 or several rods for 1-3 connectivity are placed. The described invention method allows for an unlimited variation in volume content of polarizable phase across the device.

Figure 9:
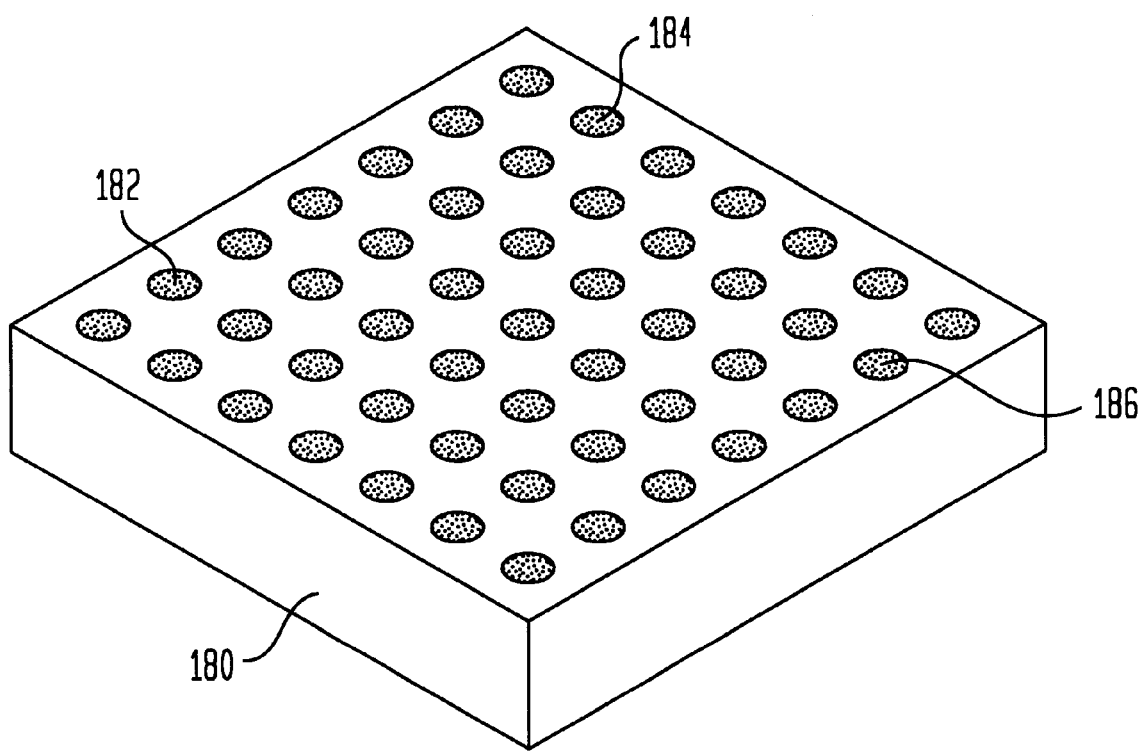
FIG. 9 is a perspective drawing showing a further embodiment according to the present invention which a composite contains multiple phases.

As yet a further embodiment of the present invention, a composite material may be formed using the indirect or direct method containing multiple polarizable phases. FIG. 9 is a prospective drawing showing such an embodiment. The figure shows polarizable phases 182, 184, and 186, embedded in a non-polarizable filler material 180. The polarizable phases may be materials which act as transmitters, receivers, sensors or actuators in the resulting transducer. Different polarizable phases are introduced into the composite during slurry/gel suspension infiltration stage for indirect processing route or by depositing different polarizable phases for direct manufacturing route. For composites processed via direct depositing route, different polarizable phases can be deposited in each layers also. The described invention allows for an unlimited number of polarizable phases in one composite structure.

Although not illustrated, a further embodiment of the present invention is a composite material where both the number of polarizable materials and the polarizable phase volume content across the device is varied. Moreover, although also not illustrated, a further embodiment of the present invention is a composite material having one or more combinations of 1- 3, 2-2, and 3-3 connectivities in a single composite.

The following example will further illustrate the present invention.

EXAMPLE 1

Piezoelectric ceramic-polymer composites with 3-3 connectivity was manufactured. Polymeric molds, having 25 mm diameters and 8 mm lengths, were manufactured using the Stratysys™ 3D Modeler™. Stratysys™ ICW-04 filament was used with a 100 micron gap between each road in a given layer. The mold design was the negative of the desired final composite structure.

The mold was built using raster fill i.e., each layer in the mold was built by depositing parallel roads of material next to each other. The liguifier temperature was maintained between 68–72° C. while the envelope temperature was maintained in the range of 36–40° C.

After the mold was completed, a high solids loading lead zirconate titanate (PZT) ceramic slurry was used to infiltrate the holes in the polymer molds. The high solids slip was developed to minimize cracking in the samples during the solvent drying and subsequent ceramic sintering phases. A commercially available spray dried PZT-5H powder (Morgan Matroc Inc., Cleveland, Ohio) was used in this slurry. Before making the slurry, the binder in the powder was burned out by heating it to 550° C. for 4 hours.

The powder was then added to deionized water, Darvan-7™ dispersant (R.T. Vanderbilt & Co., Norwalk, Conn.), and a 1-Octanol antifoaming agent (Fisher Scientific), and ball milled using 1/8" zirconia grinding media for an hour to properly mix the components and break up agglomerates. After milling, a Duramax™ B-1035 acrylic emulsion binder (Rohm and Haas, Philadelphia, Pa.) was added to the system and stirred mechanically for a few minutes to insure homogenous distribution of the binder in the slurry.

The molds were infiltrated by pouring the slurry on top of the wax molds. Excess slurry was used to overfill the mold so that a composite base would be formed upon hardening. The molds containing the high solids content PZT slurry were subsequently placed in a vacuum oven, at a pressure of 25 millibar for 20 min., to ensure complete filling of the voids. The samples were dried in an ambient atmosphere for 2 hours and then transferred to an oven maintained at 70° C. The initial slow drying step was included to further reduce the possibility of cracking in the slip.

Thermogravimetric analyses (Low temperature TGA-7, Perkin Elmer) of the polymer mold as well as the binder in the green ceramic structure were performed at 3.5° C./min in an air atmosphere to determine the burnout temperature and the amount of residue left after firing. A single heat treatment consisting of three thermal soaks was then performed as follows:

The specimens were heated to 350° C. at 1° C./min. and held for 1 hour to allow the low temperature organic components to evaporate. The temperature was then increased to 550° C. at 1.5° C./min. and held for 2 hours to remove the binder. A third soak at 800° C. for 1 hour, with a heating rate of 3.5° C./min., was necessary to impart sufficient strength to the ceramic structure for handlability. The specimens were cooled, and then sealed in a crucible containing a lead source, heated at 3.5° C./min to 1285° C., and held for 1 hour to sinter the ceramic.

The sintered samples were embedded in a non-piezoelectric Spurr epoxy (Ernest Fullam Inc., Latham, N.Y.) and cured in an oven at 70° C. for 12 hours. After removing the base and polishing both the sides the volume fraction of PZT was determined using the relation:

$$\text{Volume \%}_{CERAMIC} = (\text{density}_{COMPOSITE} - \text{density}_{POLYMER})/(\text{density}_{CERAMIC} - \text{density}_{POLYMER})$$

The sides were then electroded with an air dried silver paint (No. 200, Demetron, Liepzeger, Germany) and the composite specimens were poled in a corona poling apparatus at 70° C., properties were measure after aging the specimens for a minimum of 24 hours. The capacitance (C) and the dielectric loss factor (tan δ) were measured, before and after poling, at 1 kHz using a RLC digibridge (Model 1689M, Gen. Rad. Inc., Boston, Mass.). The dielectric constant was calculated using the relation $K=C\, d/\epsilon_o A$. Here d is the specimen thickness, A is the total electroded area and $\epsilon_o$ is the permittivity of free space ($8.85 \times 10^{-12}$ Farads/meter).

The d coefficient of the composites was measured at 100 Hz using a piezo d meter (Model CPDT-3300, Channel Products Inc., Cleveland, Ohio). The g was calculated using the relation $$g = d/\epsilon_o K.$$

TABLE I

| MATERIAL | $V_{PZT}$ | K | $d_{33}$ | $g_h$ | $d_h$ | $d_h g_h$ |
|---|---|---|---|---|---|---|
| PZT | 100 | 2300 | 550 | 5 | 20 | 100 |
| 3-3 Composite | 29 | 320 | 290 | 10 | 30 | 300 |

Units are as follows: V = %; $d_{33}$ = picoColomb/Newton; $g_h = 10^{-3}$ Volt meters/Newton; $d_h$ = picoColomb/Newton; $d_h g_h = 10^{-15}$ meters$^2$/Newton The invention described herein has been disclosed in terms of specific embodiments and applications. However, these details are not meant to be limiting and other embodiments, in light of this teaching, would be obvious to persons skilled in the art. Accordingly, it is to be understood that the drawings and descriptions are illustrative of the principles of the invention, and should not be construed to limit the scope thereof.

We claim:

1. A process for making a composite comprising the steps of:

a) forming a polymer composition into a three-dimensional mold;

b) filling said three-dimensional mold with at least one ceramic containing compositions, said at least one ceramic containing composition having a higher melting point than said polymer composition;

c) drying, gelling or curing said at least one ceramic containing composition in the mold to harden the at least one ceramic containing composition in the three-dimensional mold;

d) removing the three-dimensional mold from the hardened material thereby forming voids;

e) sintering the hardened material to provide a slntered ceramic structure: and f) filling the voids with a second composition which has a piezoelectric coefficient which is substantially different from the piezoelectric coefficient of said ceramic structure;

wherein steps a–e yield a controlled, non-random piezoelectric ceramic composite having 2-3, 3-2 or 3-3 connectivity with respect to the sintered ceramic and the second composition throughout the composite.

2. The process of claim 1 wherein during step b, a base is formed with said ceramic containing composition.

3. The process of claim 1 wherein the polymer composition is selected from the group consisting of waxed based thermoplastic polymers, elastomers, thermoplastic polymers, laser curable polymers, ultra violet ray curable polymer, waxes, tackifiers or combinations thereof.

4. The process of claim 1 wherein the ceramic containing composition or compositions is selected from the group consisting of Pb(Zr,Ti)O$_3$, BaTiO$_3$, PbZrO$_3$, PbTiO$_3$, $PbNb_2O_6$, $(Pb,Ca)TiO_3$, $(Pb,Sm)TiO_3$, $Pb(NbO_2)_2/PbTiO_3$, $(1-x)Pb(Mg_{1/3}Nb_{2/3})O_3$—$xPbTiO_3$, $(1-x-y)Pb(Zn_{1/3}Nb_{2/3})O_3$—$xPbTiO_3$—$yBaTiO_3$, and $(1-x-y)Pb(Zn_{1/3}Nb_{2/3})O_3$—$xBaTiO_3$—$yPbTiO_3$, xPZN-(1−x)PMN, xPMN-(1−x)PZT, xPZN-(1−x)PZT.

5. The process of claim 1 wherein at least one of the ceramic containing compositions is piezoelectric.

6. The process of claim 5 wherein two or more different ceramic containing compositions are used to fill said polymer mold.

7. The process of claim 1 wherein two or more different ceramic containing compositions are used to fill said polymer mold.

8. The process of claim 1 wherein the removal of said polymer mold is accomplished by heating or solvent etching.

9. The process of claim 1 wherein the composition used to fill the voids caused by the removal of the polymer mold is selected from the group consisting of epoxy, silicone rubber, poly(vinylidene flouride) and copolymers thereof, polyvinylchloride, polyvinylflouride, glass, or ceramic.

10. The process of claim 1 wherein the ceramic containing composition or compositions are substantially in the form of a gel.

11. The process of claim 1 wherein the ceramic containing composition or compositions are substantially in the form of a slurry.

12. The process of claim 1 wherein the removal of the three-dimensional mold occurs during said sintering.

13. A process for making a controlled, non-random piezoelectric ceramic composite having 2-3, 3-2 or 3-3 connectivity comprising the steps of:
   a) forming a polymer composition into a three-dimensional mold;
   b) filling said three-dimensional mold with at least one ceramic containing compositions, said at least one ceramic containing composition having a higher melting point than said polymer composition;
   c) drying, gelling or curing said at least one ceramic containing composition in the mold to harden the at least one ceramic containing composition in the three-dimensional mold;
   d) removing the three-dimensional mold from the hardened material thereby forming voids;
   e) sintering the hardened material to provide a sintered ceramic structure: and
   f) filling the voids with a second composition which has a piezoelectric coefficient which is substantially different from the piezoelectric coefficient of said ceramic structure.

14. The process of claim 13 wherein the removal of the three-dimensional mold occurs during said sintering.

* * * * *